US009460924B2

(12) United States Patent
Maszara et al.

(10) Patent No.: US 9,460,924 B2
(45) Date of Patent: Oct. 4, 2016

(54) SEMICONDUCTOR DEVICE HAVING STRUCTURE WITH FRACTIONAL DIMENSION OF THE MINIMUM DIMENSION OF A LITHOGRAPHY SYSTEM

(75) Inventors: Witold P. Maszara, Morgan Hill, CA (US); Qi Xiang, San Jose, CA (US)

(73) Assignee: Globalfoundries, Inc., Grand Cayman (KY)

( * ) Notice: Subject to any disclaimer, the term of this patent is extended or adjusted under 35 U.S.C. 154(b) by 375 days.

(21) Appl. No.: 11/691,332

(22) Filed: Mar. 26, 2007

(65) Prior Publication Data

US 2008/0237803 A1 Oct. 2, 2008

(51) Int. Cl.
*H01L 21/00* (2006.01)
*H01L 21/033* (2006.01)

(52) U.S. Cl.
CPC ................. *H01L 21/0337* (2013.01)

(58) Field of Classification Search
CPC ........... H01L 21/3086; H01L 21/0337; H01L 29/06; H01L 29/0657
USPC ............................. 438/48, 736, 157; 257/368
See application file for complete search history.

(56) References Cited

U.S. PATENT DOCUMENTS

| | | | |
|---|---|---|---|
| 5,310,451 A * | 5/1994 | Tejwani et al. | 438/459 |
| 5,821,169 A * | 10/1998 | Nguyen et al. | 438/736 |
| 6,063,688 A * | 5/2000 | Doyle et al. | 438/424 |
| 7,078,348 B1 | 7/2006 | Singh et al. | |
| 7,081,387 B2 | 7/2006 | Furukawa et al. | |
| 7,084,018 B1 | 8/2006 | Ahmed et al. | |
| 7,090,963 B2 | 8/2006 | Medeiros et al. | |
| 7,105,391 B2 | 9/2006 | Doris et al. | |
| 2003/0215988 A1* | 11/2003 | Zahurak et al. | 438/157 |
| 2006/0068596 A1* | 3/2006 | Dobuzinsky et al. | 438/740 |
| 2006/0110842 A1* | 5/2006 | Chang et al. | 438/51 |
| 2006/0211260 A1 | 9/2006 | Tran et al. | |
| 2007/0040224 A1* | 2/2007 | Green et al. | 257/368 |
| 2007/0052133 A1* | 3/2007 | Gostkowski et al. | 264/241 |
| 2007/0200222 A1* | 8/2007 | Ehmke et al. | 257/704 |
| 2007/0210355 A1* | 9/2007 | Izumida | 257/288 |
| 2008/0122125 A1* | 5/2008 | Zhou | H01L 21/3088 257/797 |
| 2008/0261349 A1* | 10/2008 | Abatchev et al. | 438/106 |

* cited by examiner

*Primary Examiner* — Alexander Ghyka
*Assistant Examiner* — Abdulfattah Mustapha
(74) *Attorney, Agent, or Firm* — Farjami & Farjami LLP

(57) ABSTRACT

A method for forming a semiconductor device is provided including processing a wafer having a spacer layer and a structure layer, the spacer layer is over the structure layer. The method continues including forming a first sidewall spacer from the spacer layer, forming a structure strip from the structure layer below the first sidewall spacer, forming a masking structure over and intersecting the structure strip, and forming a vertical post from the structure strip below the masking structure.

6 Claims, 6 Drawing Sheets

SEMICONDUCTOR DEVICE HAVING STRUCTURE WITH FRACTIONAL DIMENSION OF THE MINIMUM DIMENSION OF A LITHOGRAPHY SYSTEM

CROSS-REFERENCE TO RELATED APPLICATION

The present application contains subject matter related to a concurrently filed U.S. patent application by Witold P. Maszara entitled "Semiconductor Device Having Structure With Sub-lithography Dimensions". The related application is assigned to Advanced Micro Devices, Inc. and is identified by U.S. patent application Ser. No. 11/691,347 filed on Mar. 26, 2007, published on Oct. 2, 2008 with Publication Number US 2008-0241574 A1, and now Abandoned.

TECHNICAL FIELD

The present invention relates generally to semiconductor device, and more particularly to a semiconductor device having structural fractional pitch of the minimum pitch of a lithography system.

BACKGROUND ART

Modern electronics, such as smart phones, personal digital assistants, location based services devices, digital cameras, music players, servers, and storage arrays, are packing more semiconductor devices into an ever-shrinking physical space with expectations for decreasing cost. One cornerstone for devices to continue proliferation into everyday life is the integration of more functions into a given area of the semiconductor device. Numerous technologies have been developed to meet these requirements.

One approach to increase the density in a semiconductor device involves a technology to transform and shrink images onto a wafer. This process is called lithography or photolithography. Lithography systems have limitations of how small images may be reduced onto a wafer and these limitations bound the minimum dimensions of the semiconductor device. Some examples of the minimum dimensions for the semiconductor device are minimum gate length, structure width, or spacing between structures.

Various types of lithography systems, such as proximity lithography, contact lithography, projection lithography, or immersion lithography, have been used to increase density in a semiconductor device. Each has their advantages and drawbacks but all have minimum dimension limitations as discussed above.

Lithography systems use a light source to transfer an image from a mask to a wafer. Different light sources, such as a ultra-violet light of different wavelengths, different mask technologies, or both to improve the density in a semiconductor device. Again, each approach has their advantages and drawbacks but all have minimum dimension limitations as discussed above.

Thus, a need still remains for a semiconductor device providing increased density beyond the limitations of the lithography system, improved yields, lower cost, and increased use of existing manufacturing equipments. In view of the ever-increasing need to save costs and improve efficiencies, it is increasingly critical that answers be found to these problems.

Solutions to these problems have been long sought but prior developments have not taught or suggested any optical lithography solutions and, thus, solutions to these problems have long eluded those skilled in the art.

DISCLOSURE OF THE INVENTION

The present invention provides a method for forming a semiconductor device including processing a wafer having a spacer layer and a structure layer, the spacer layer is over the structure layer. The present invention also provides forming a first sidewall spacer from the spacer layer, forming a structure strip from the structure layer below the first sidewall spacer, forming a mask structure over and intersecting the structure strip, and forming a vertical post from the structure strip below the mask structure.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
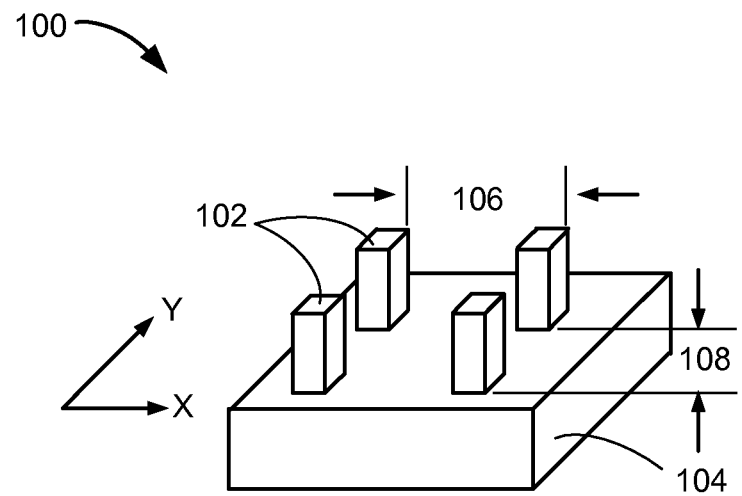
FIG. 1 is an isometric view of a portion of a semiconductor device in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention. Likewise, the drawings showing embodiments of the system are semi-diagrammatic and not to scale and, particularly, some of the dimensions are for the clarity of presentation and are shown greatly exaggerated in the drawing figures. In addition, where multiple embodiments are disclosed and described having some features in common, for clarity and ease of illustration, description, and comprehension thereof, similar and like features one to another will ordinarily be described with like reference numerals.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

For expository purposes, the term "horizontal" as used herein is defined as a plane parallel to the conventional semiconductor device surface, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements.

The term "processing" as used herein includes deposition of material or photoresist, patterning, exposure, development, etching, cleaning, and/or removal of the material or photoresist as required in forming a described structure. The term "system" as used herein means and refers to the method and to the apparatus of the present invention in accordance with the context in which the term is used.

Semiconductor manufacturing typically involves lithography systems (not shown) or also referred to as photolithography systems (not shown). Some examples of lithography systems are proximity lithography, contact lithography, projection lithography, or immersion lithography. The lithography systems use a light source (not shown) to transfer patterns (not shown) from a mask (not shown) onto a semiconductor wafer. The patterns from the mask may include parallel structures or adjacent structures.

The term "pitch" as used herein refers to a measure between the parallel structures or the adjacent structures of the semiconductor wafer transferred by the lithography system used for the manufacture the semiconductor device. The pitch may be measured from side to side of the same side of the adjacent or parallel structures. The term "minimum pitch" as used herein refers to the minimum pitch value that may be achieved by the lithography system used for the manufacture the semiconductor device.

Referring now to FIG. 1, therein is an isometric view of a portion of a semiconductor device 100 in an embodiment of the present invention. The portion of the semiconductor device 100, such as a semiconductor die, an integrated circuit die, a device having a microelectromechanical system (MEMS), or a device having micro-mechanical system, includes vertical posts 102 on a device layer 104 of the semiconductor device 100.

The vertical posts 102, such as a portion of a circuit element, a portion of a MEMS element, a portion of a redistribution structure or a spacer structure, are shown substantially along an x-axis and a y-axis. The vertical posts 102 along the x-axis have a pitch of a first pitch 106. The first pitch 106 may have a value in a range from one quarter of the minimum pitch to the minimum pitch or a predetermined pitch greater than the minimum pitch as required by the design of the semiconductor device 100. The vertical posts 102 along the y-axis have a second pitch 108. The second pitch 108 may have a value in a range from one quarter of the minimum pitch to the minimum pitch or a predetermined pitch greater than the minimum pitch as required by the design of the semiconductor device 100. The vertical posts 102 may be comprised of an electrically conductive material, such as a metal, or an electrically nonconductive material, such as a dielectric.

For illustrative purposes, the vertical posts 102 along the x-axis and the y-axis have pitches of the first pitch 106 and the second pitch 108, respectively, although it is understood that the vertical posts 102 along both axes may have substantially the same pitch or different pitches. Also for illustrative purposes, the vertical posts 102 are shown substantially the same, although it is understood that the vertical posts 102 may be different. Further for illustrative purposes, the vertical posts 102 are shown in an array configuration, although it is understood that the configuration of the vertical posts 102 may be in a different configuration. Yet further for illustrative purposes, the vertical posts 102 are shown as having a pitch that is a quarter of the minimum pitch, although it is understood that other structures may have a space that is a quarter of the minimum pitch.

The device layer 104, such as a semiconductor substrate, a redistribution layer, a portion of a circuit element, or a portion of a MEMS element, may represent any number of layers of the semiconductor device 100. Similarly, the vertical posts 102 may be a portion of any number of layers of the semiconductor device 100.

Figure 2:
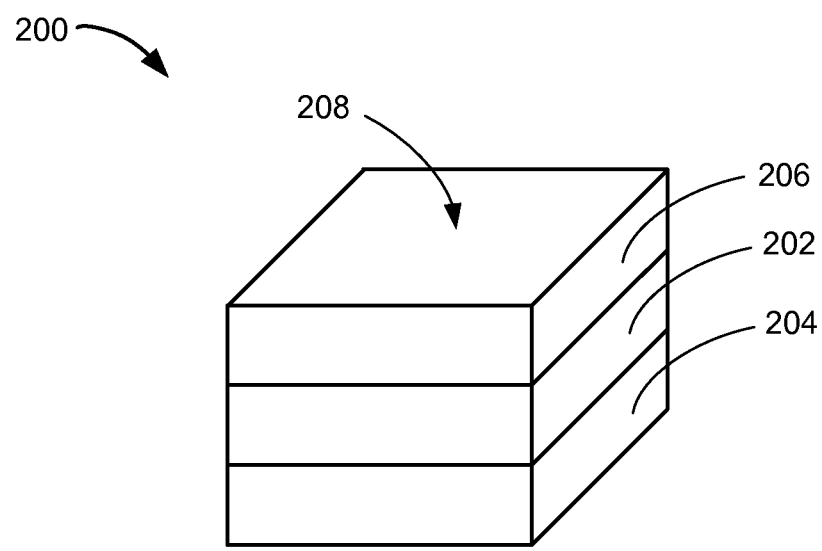
FIG. 2 is an isometric view of a portion of a wafer in an embodiment of the present invention.

Referring now to FIG. 2, therein is an isometric view of a portion of a wafer 200 in an embodiment of the present invention. The wafer 200 includes a structure layer 202 over a device layer 204. A spacer layer 206, such as a masking layer, is over the structure layer 202. The structure layer 202 and the spacer layer 206 are part of an active side 208 of the device layer 204. The device layer 204 may represent the device layer 104 of FIG. 1.

The structure layer 202 may be comprised of an electrically conductive material or an electrically nonconductive material. The spacer layer 206 may be comprised of a number of different materials, such as polycrystalline silicon (polysilicon). For illustrative purposes, the wafer 200 is shown having the structure layer 202 and the spacer layer 206 over the device layer 204, although it is understood that the number of layers may differ.

Figure 3:
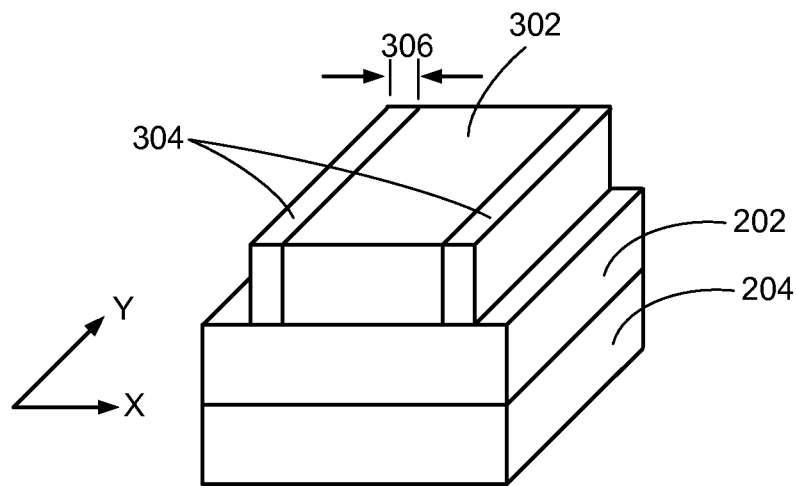
FIG. 3 is the structure of FIG. 2 in a first spacer formation phase.

Referring now to FIG. 3, therein is the structure of FIG. 2 in a spacer formation phase. The spacer layer 206 of FIG. 2 undergoes a patterning process, such as an etch utilizing predetermined patterned photoresist (not shown), forming a first strip 302 from the spacer layer 206 of FIG. 2. For illustrative purposes, the first strip 302 is shown as a single instance, although it is understood that multiple parallel instances of the first strip 302 may be formed. The minimum measure between adjacent instances of the first strip 302 may be expressed as a pitch that is the minimum pitch.

First sidewall spacers 304, such as spacers of silicon nitride or silicon oxide, are formed along sides of the first strip 302. The first sidewall spacers 304 may be formed along two opposite sides of the first strip 302 by selectively removing the first sidewall spacers 304 along the other opposite sides of the first strip 302. The first sidewall spacers 304 may be formed in a number of different processes available to one ordinary skilled in the art. The first sidewall spacers 304 are shown substantially parallel to the y-axis. The first sidewall spacers 304 may be formed with each having a spacer width 306 that is a fraction of the minimum pitch, such as a tenth to a quarter of the minimum pitch. The structure layer 202 and the device layer 204 are substantially unaffected by the formation of the first strip 302 and the first sidewall spacers 304.

For illustrative purposes, the first sidewall spacers 304 are shown parallel to the y-axis, although it is understood that the first sidewall spacers 304 may be parallel to the x-axis. Also for illustrative purposes, the sides of the first strip 302 is shown as parallel to the x-axis or the y-axis, although it is understood that the first strip 302 may be formed in an angle not parallel to the x-axis or the y-axis. Similarly the first sidewall spacers 304 may be formed in the same angle as the first strip 302 that is not parallel to the x-axis or the y-axis. Further for illustrative purposes, the first sidewall spacers 304 are shown on two opposite sides of the first strip 302, although it is understood that the first sidewall spacers 304 may be formed on any number of sides of the first strip 302.

Figure 4:
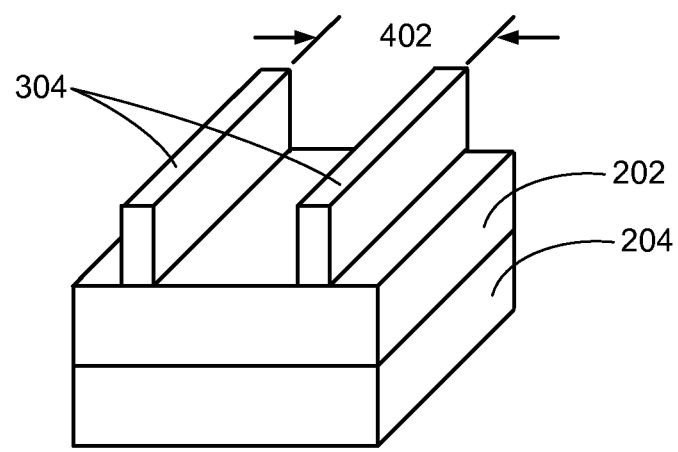
FIG. 4 is the structure of FIG. 3 in a first mask phase.

Referring now to FIG. 4, therein is the structure of FIG. 3 in a first mask phase. The first mask phase represents a mask phase that is first described and does not necessarily refer to the first mask in the manufacture of the wafer 200 of FIG. 2.

The first strip 302 of FIG. 3 is removed leaving the first sidewall spacers 304 over the structure layer 202 and the device layer 204. The first strip 302 may be removed by a number of different processes available to one ordinary skilled in the art. The first sidewall spacers 304 may have a pitch with a value of a first pitch 402. The first pitch 402 may have a value in a range from one quarter of the minimum pitch to the minimum pitch or a predetermined pitch greater than the minimum pitch as required by the design of the wafer 200. The first sidewall spacers 304 expose portions of the structure layer 202 not covered by the first sidewall spacers 304.

Figure 5:
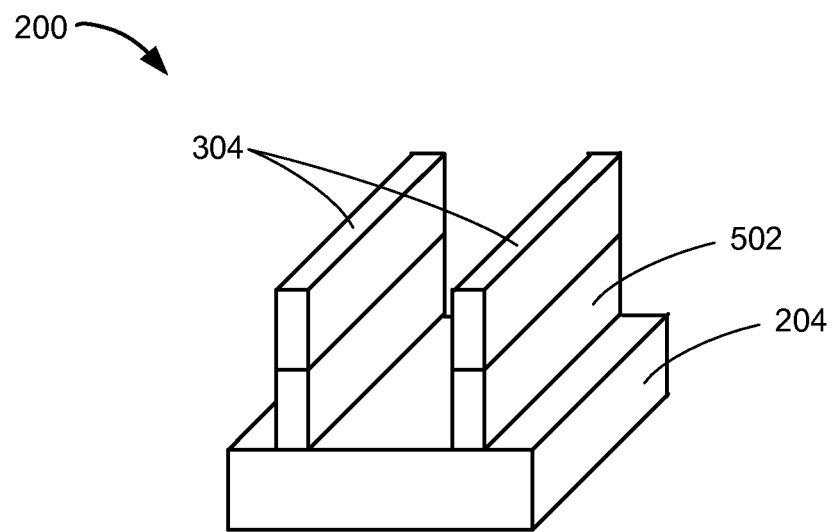
FIG. 5 is the structure of FIG. 4 in a first etch phase.

Referring now to FIG. 5, therein is the structure of FIG. 4 in a first etch phase. The first etch phase represents an etch phase that is first described and does not necessarily refer to the first etch in the manufacture of the wafer 200.

The first sidewall spacers 304 function as a mask for the structure layer 202 of FIG. 4. The structure of FIG. 4 undergoes an etching process removing the structure layer 202 not covered by the first sidewall spacers 304 and exposing the device layer 204. The etching process forms structure strips 502 from the structure layer 202.

Figure 6:
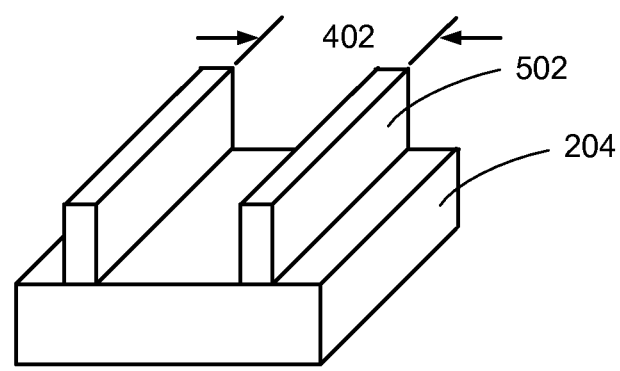
FIG. 6 is the structure of FIG. 5 in a first mask removal phase.

Referring now to FIG. 6, therein is the structure of FIG. 5 in a first mask removal phase. The first sidewall spacers 304 of FIG. 5 are removed leaving the structure strips 502 over the device layer 204. The structure strips 502 have the first pitch 402. For illustrative purposes, the structure strips 502 are shown as having substantially the same width as the spacer width 306 of FIG. 3, although it is understood that the width of the structure strips 502 may be different to the spacer width 306.

Figure 7:
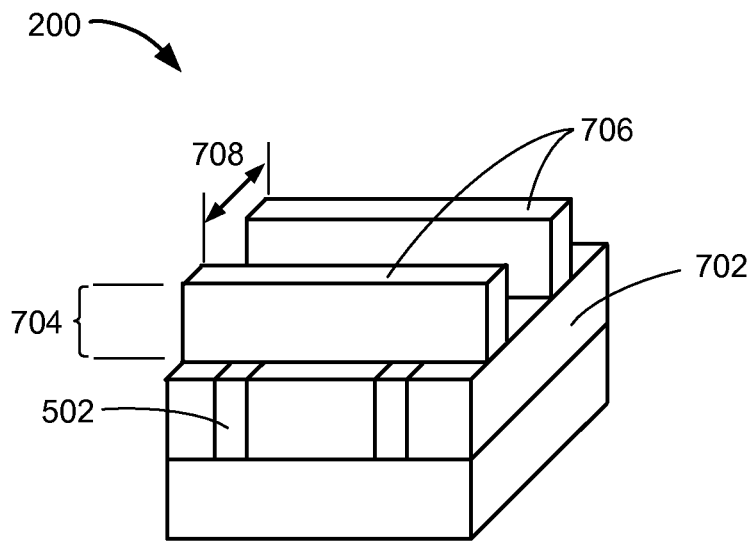
FIG. 7 is the structure of FIG. 6 in a second mask phase.

Referring now to FIG. 7, therein is the structure of FIG. 6 in a second mask phase. A filler 702, such as an oxide, surrounds the structure strips 502. The filler 702 may be applied by a number of different processes available to one ordinary skilled in the art. The filler 702 and the structure strips 502 undergo a planarization process, such as a chemical and mechanical planarization (CMP), such that the top surface of the structure strips 502 and the filler 702 are coplanar.

A masking structure 704, such as an oxide, is formed over the structure strips 502 and the filler 702. The masking structure 704 has parallel structures 706 that intersect the vertical planes of the structure strips 502. The intersection may be orthogonal to the vertical planes of the structure strips 502. The parallel structures 706 may have a second pitch 708. The second pitch 708 may have a value in the range from a fraction of the minimum pitch, such as half of the minimum pitch, to the size of the wafer 200.

The masking structure 704 may be formed by a number of different processes available to one ordinary skilled in the art. For example, the parallel structures 706 may be formed by a conventional lithography image transfer such that the minimum value of the second pitch 708 is the minimum pitch. The parallel structures 706 may be alternatively formed by a process similar to forming the first sidewall spacers 304 of FIG. 4 such that the parallel structures 706 are sidewall spacers and the minimum value of the second pitch 708 is a quarter of the minimum pitch.

Figure 8:
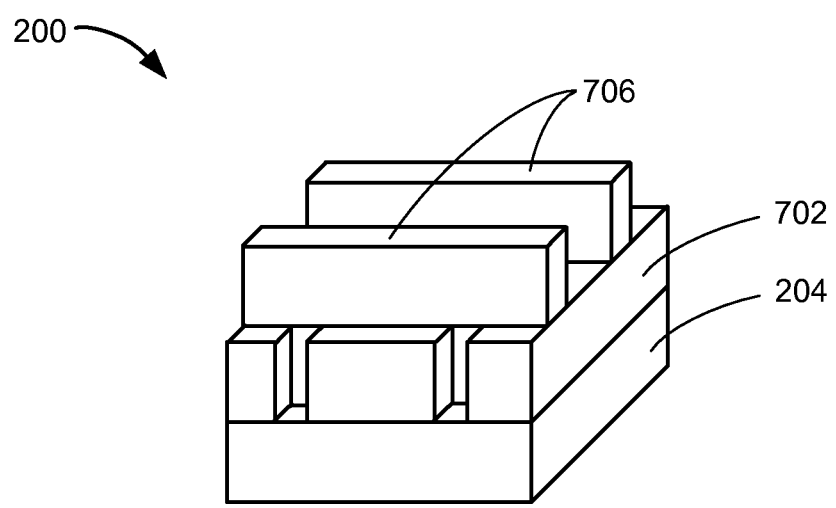
FIG. 8 is the structure of FIG. 7 in a second etch phase.

Referring now to FIG. 8, therein is the structure of FIG. 7 in a second etch phase. The structure of FIG. 7 undergoes an etch process, such as a selective anisotropic etch, removing portions of the structure strips 502 of FIG. 7 not covered by the parallel structures 706. The etch process exposes the device layer 204 in the opening of the filler 702.

Figure 9:
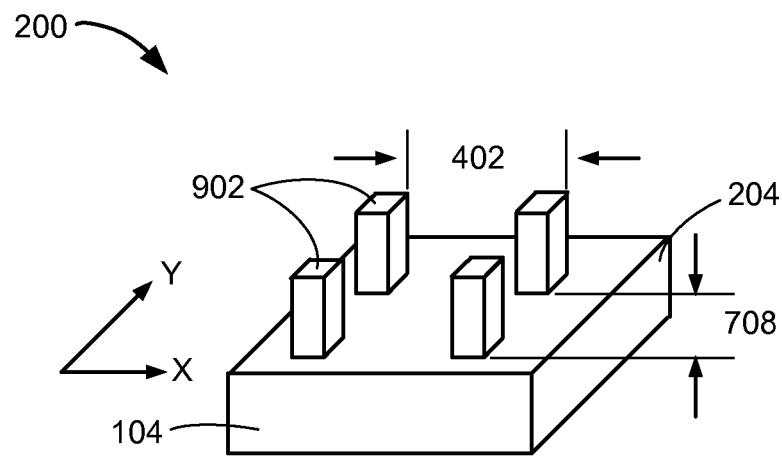
FIG. 9 is the structure of FIG. 8 in a second mask removal phase.

Referring now to FIG. 9, therein is the structure of FIG. 8 in a second mask removal phase. The parallel structures 706 of FIG. 8 and the filler 702 of FIG. 8 are removed exposing vertical posts 902 over the device layer 204. The vertical posts 902 may represent the vertical posts 102 of FIG. 1. The first pitch 402 and the second pitch 708 of the vertical posts 902 may represent the first pitch 106 of FIG. 1 and the second pitch 108 of FIG. 1, respectively. The structure of FIG. 9 may undergo singulation forming devices, such as the semiconductor device 100 of FIG. 1.

Figure 10:
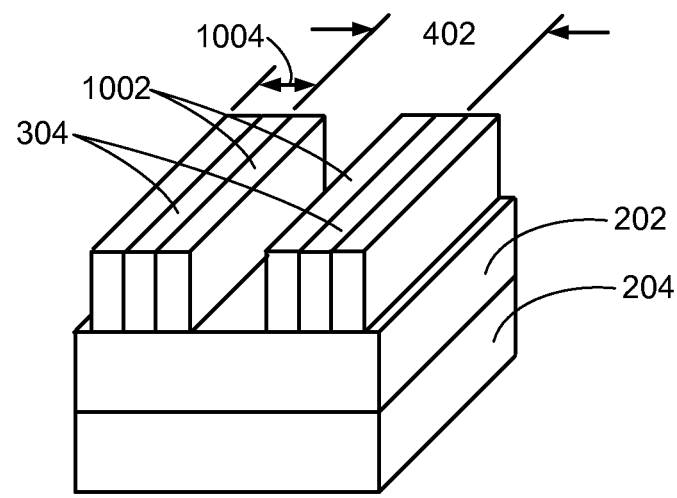
FIG. 10 is the structure of FIG. 4 in a second spacer formation phase.

Referring now to FIG. 10, therein is shown the structure of FIG. 4 in a second spacer formation phase. Second sidewall spacers 1002 may be formed along sides of the first sidewall spacers 304 over the structure layer 202 and the device layer 204. The first sidewall spacers 304 have the first pitch 402. The second sidewall spacers 1002 have a second pitch 1004. The second pitch 1004 has a range about a quarter of the minimum pitch to a half of the minimum pitch.

The second sidewall spacers 1002 may be formed by a number different process. For example, a layer (not shown) of a material of the second sidewall spacers 1002 may be applied over the structure of FIG. 4. A photoresist layer (not shown) may be patterned over the layer and the layer may be removed, such as etching, forming the second sidewall spacers 1002 along the sides of the first sidewall spacers 304.

Multiple development steps may be performed for forming the second sidewall spacers 1002. For example, the multiple developments may be performed with different reticles (not shown) forming different structural patterns and with etching steps. Another example, the same reticle (not shown) may be used with double exposure with the reticle shifted forming the structural patterns and with etching steps.

The second sidewall spacers 1002 may be further processed continuing with the phases described in FIG. 5 to FIG. 9 forming the vertical posts 902 of FIG. 9. The vertical posts 902 continued from this phase may have the second pitch 1004 as the first pitch 402 of FIG. 9, the second pitch 708 of FIG. 9, or both.

Figure 11A:
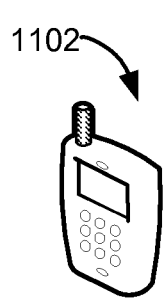
FIGS. 11A, 11B, and 11C are schematic views of examples of electronics systems in which various aspects of the present invention may be implemented.
Figure 11B:
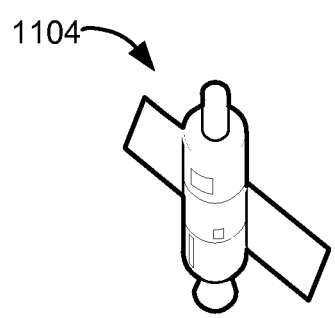
Figure 11C:
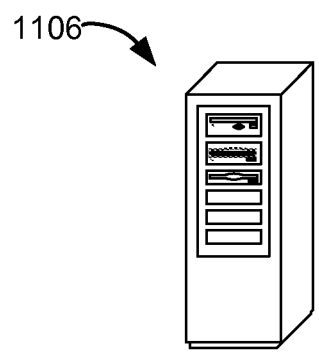

Referring now to FIGS. 11A, 11B, and 11C, therein are shown schematic views of examples of electronics systems in which various aspects of the present invention may be implemented. A smart phone 1102, a satellite 1104, and a compute system 1106 are examples of the electronic systems using the present invention. The electronic systems may be any system that performs any function for the creation, transportation, storage, and consumption of information. For example, the smart phone 1102 may create information by transmitting voice to the satellite 1104. The satellite 1104 is used to transport the information to the compute system 1106. The compute system 1106 may be used to store the information. The smart phone 1102 may also consume information sent from the satellite 1104.

The electronic systems, such as the smart phone 1102, the satellite 1104, and the compute system 1106, include a one or more subsystem, such as a printed circuit board having the present invention or an electronic assembly having the present invention. The electronic system may also include a subsystem, such as an adapter card.

Figure 12:
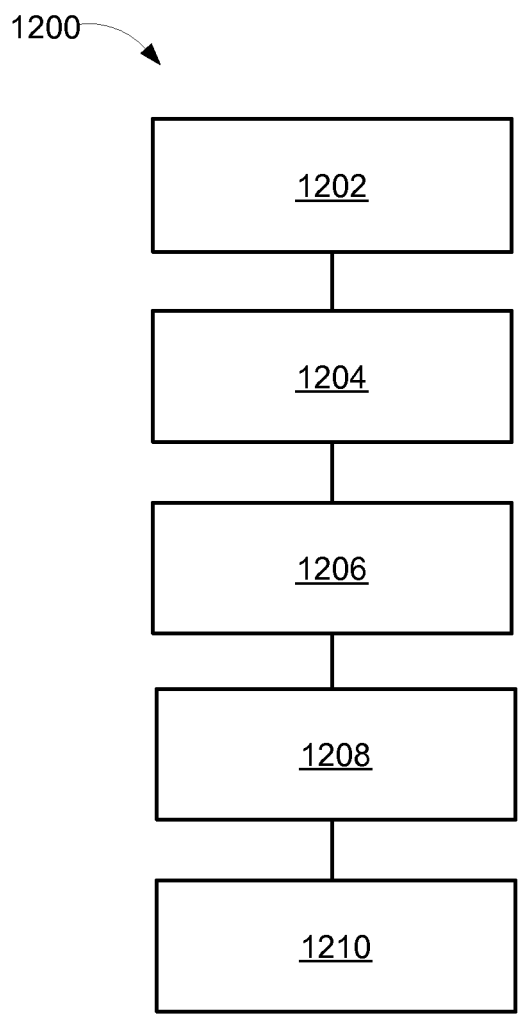
FIG. 12 is a flow chart of a method for manufacture of the semiconductor device in an embodiment of the present invention.

Referring now to FIG. 12, therein is a flow chart of a method 1200 for manufacture of the semiconductor device in an embodiment of the present invention. The method 1200 includes processing a wafer having a spacer layer and a structure layer, the spacer layer is over the structure layer in a block 1202; forming a first sidewall spacer from the spacer layer in a block 1204; forming a structure strip from the structure layer below the first sidewall spacer in a block 1206; forming a mask structure over and intersecting the structure strip in a block 1208; and forming a vertical post from the structure strip below the mask structure in a block 1210.

A principle aspect of the embodiments is that the present invention increases densities of structures below the minimum pitch capability of the lithography system used to manufacture a semiconductor device. The structures, such as micropillars, having the pitch that is a fraction of the minimum pitch, such as half of the minimum pitch, may be used in numerous applications, such as in integrated circuits or MEMS.

Another aspect of the embodiment provides vertical posts or micropillars that may be formed in any layer of the semiconductor device.

Yet another aspect of the embodiments provides the vertical posts may be formed with different materials, such as electrically conductive or electrically nonconductive, to increase density of circuits, routing in redistribution layers, spacers, or MEMS elements.

Yet another aspect of the embodiments provides the method for the manufacture of devices of different structures of varying sizes, configurations, and stacking options.

Yet another aspect of the embodiments provides reuse of existing and mature lithography systems while providing increased integration and density.

Yet another important aspect of the embodiments is that it valuably supports and services the historical trend of reducing costs, simplifying systems, and increasing performance.

These and other valuable aspects of the present invention consequently further the state of the technology to at least the next level.

Thus, it has been discovered that the semiconductor system of the present invention furnishes important and heretofore unknown and unavailable solutions, capabilities, and functional aspects for increased density, improved yield, and lowered cost. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method for forming a semiconductor device comprising:
    processing a wafer having a spacer layer and a structure layer formed over a device layer, the spacer layer being a topmost layer having an exposed top surface in said wafer and disposed directly on a top surface of the structure layer, and the structure layer disposed directly on a top surface of the device layer, wherein no intermediate layer exists between the spacer layer and the structure layer and between the structure layer and the device layer;
    depositing first sidewall spacers adjacent to and against parallel sides of the spacer layer, said first sidewall spacers being isolated parallel strips deposited directly on the top surface of said structure layer with no intermediate layer between the first sidewall spacers and the structure layer, each of said first sidewall spacers having a width of a tenth to a quarter of a minimum pitch capability of a lithography system utilized to manufacture said semiconductor device, said minimum pitch being a distance between said first sidewall spacers;
    forming structure strips from the structure layer directly below the first sidewall spacers;
    forming a filler around the structure strips;
    planarizing the structure strips and the filler so that the structure strips and the filler have a coplanar top surface;
    forming a masking structure having second sidewall spacers directly on the coplanar top surface of the filler and the structure strips, and intersecting the structure strips, wherein no intermediate layer exists between the second sidewall spacers and the structure strips;
    forming vertical posts from the structure strips directly below intersections of the second sidewall spacers and the structure strips, the vertical posts having a pitch in a range about said minimum pitch to said quarter of the minimum pitch capability of said lithography system utilized to manufacture said semiconductor device;
    wherein at least one of the vertical posts comprises electrically conductive material.

2. The method as claimed in claim 1 further comprising forming an electronic system or a subsystem with the semiconductor device.

3. A method for forming a semiconductor device comprising:
    processing a wafer having a spacer layer and a structure layer formed over a device layer, the spacer layer having an exposed top surface in the wafer and being disposed directly on a top surface of the structure layer, and the structure layer disposed directly on a top surface of the device layer, wherein no intermediate layer exists between the spacer layer and the structure layer and between the structure layer and the device layer;
    depositing first sidewall spacers adjacent to and against parallel sides of the spacer layer, said first sidewall spacers being isolated parallel strips deposited directly on the top surface of said structure layer with no intermediate layer between the first sidewall spacers and the structure layer, each of said first sidewall spacers having a width of a tenth to a quarter of a minimum pitch capability of a lithography system utilized to manufacture said semiconductor device, said minimum pitch being a distance between said first sidewall spacers;
    removing the spacer layer remaining between the first sidewall spacers;
    depositing second sidewall spacers adjacent to and against the sides of first sidewall spacers;
    removing the first sidewall spacers;

forming structure strips from the structure layer directly below the second sidewall spacers;

forming a filler around the structure strips;

planarizing the structure strips and the filler so that the structure strips and the filler have a coplanar top surface;

forming parallel structures directly on the coplanar top surface of the filler and the structure strips, and intersecting the structure strips, wherein no intermediate layer exists between the parallel structures and the structure strips;

forming vertical posts from the structure strips directly below intersections of the parallel structures and the structure strips, the vertical posts having a pitch in a range about said minimum pitch to said quarter of the minimum pitch capability of said lithography system utilized to manufacture said semiconductor device;

wherein at least one of the vertical posts comprises electrically conductive material.

4. The method as claimed in claim 3 wherein forming the structure strips from the structure layer below the second sidewall spacers includes etching the structure layer not covered by the second sidewall spacers.

5. The method as claimed in claim 3 wherein forming the vertical posts from the structure strips below the parallel structures includes etching the structure strips not covered by the parallel structures.

6. The method as claimed in claim 3 wherein forming the vertical posts includes:

etching the structure strips not covered by the parallel structures; and removing the filler and the parallel structures.

* * * * *